(12) United States Patent
Terai et al.

(10) Patent No.: US 8,816,352 B2
(45) Date of Patent: Aug. 26, 2014

(54) DISPLAY DEVICE AND ELECTRONIC DEVICE

(75) Inventors: Yasuhiro Terai, Kanagawa (JP); Toshiaki Arai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/365,775

(22) Filed: Feb. 3, 2012

(65) Prior Publication Data

US 2012/0228623 A1  Sep. 13, 2012

(30) Foreign Application Priority Data

Mar. 10, 2011  (JP) ................. 2011-053288

(51) Int. Cl.
*H01L 27/14*  (2006.01)

(52) U.S. Cl.
USPC ............. 257/72; 257/776; 438/149; 438/158; 438/161

(58) Field of Classification Search
CPC .............................. H01L 21/00; H01L 21/027
USPC ...................... 257/72; 438/104, 158, 143, 151
See application file for complete search history.

(56) References Cited

U.S. PATENT DOCUMENTS

| 6,380,009 | B1* | 4/2002 | Battersby ...................... 438/161 |
| 2006/0086978 | A1* | 4/2006 | Kobayashi ..................... 257/347 |
| 2007/0093002 | A1* | 4/2007 | Maekawa et al. ............. 438/149 |
| 2009/0140438 | A1* | 6/2009 | Yamazaki et al. ............ 257/776 |
| 2009/0239335 | A1* | 9/2009 | Akimoto et al. .............. 438/104 |
| 2010/0279474 | A1* | 11/2010 | Akimoto et al. .............. 438/158 |

FOREIGN PATENT DOCUMENTS

| JP | 2007-519256 | 7/2007 |
| JP | 2008-085048 | 4/2008 |

OTHER PUBLICATIONS

Cetin Kilic and Alex Zunger; n-type doping of oxides by hydrogen; Applied Physics Letters; vol. 81, No. 1; Jul. 1, 2002.

* cited by examiner

*Primary Examiner* — Matthew W Such
*Assistant Examiner* — Frederick B Hargrove
(74) *Attorney, Agent, or Firm* — Sheridan Ross P.C.

(57) ABSTRACT

Disclosed herein is a display device including: a thin film transistor; and a wiring layer; wherein the thin film transistor includes a semiconductor layer, a gate electrode disposed so as to be opposed to the semiconductor layer, the gate electrode being different in thickness from the wiring layer, and a gate insulating film between the semiconductor layer and the gate electrode.

16 Claims, 16 Drawing Sheets

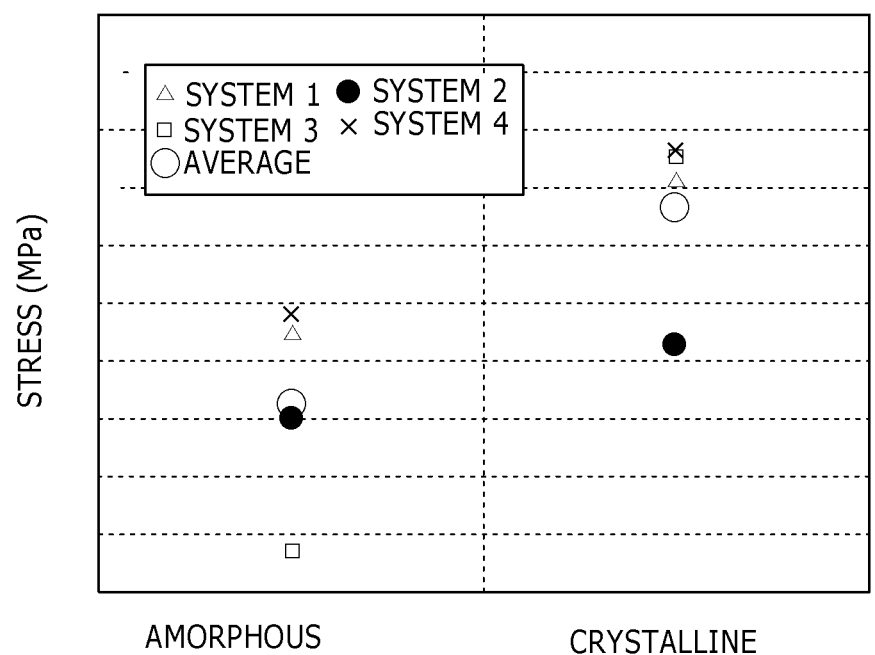

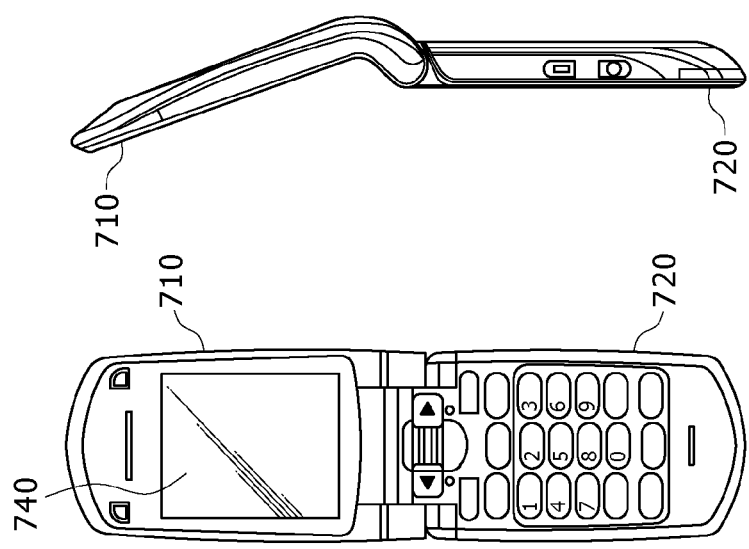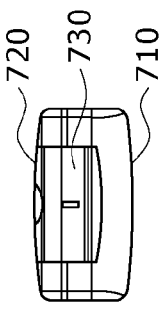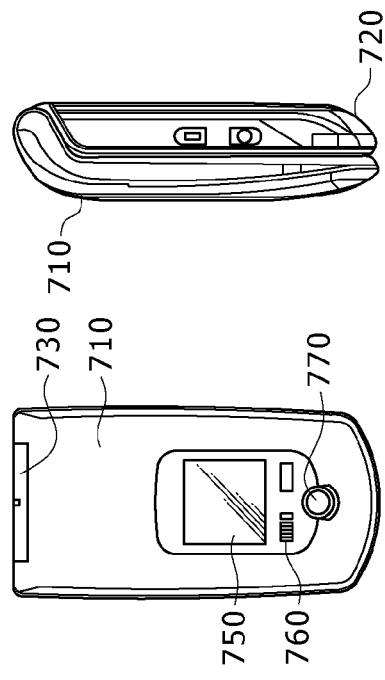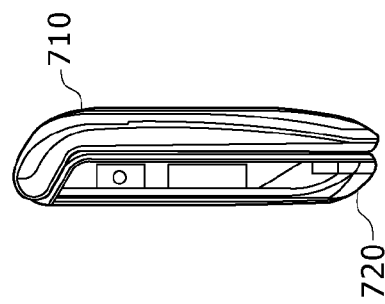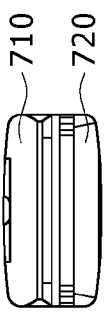

DISPLAY DEVICE AND ELECTRONIC DEVICE

BACKGROUND

The present disclosure relates to a display device including a thin film transistor (TFT) and a wiring layer and an electronic device.

Oxides including zinc (Zn) and indium (In) exhibit excellent properties as an active layer for a semiconductor device, and have recently been under development with an objective of application to TFTs, light emitting devices, transparent conductive films, and the like (for example JP-T-2007-519256, Japanese Patent Laid-Open No. 2008-85048, Cetin Kilic and one other, "n-type doping of oxides by hydrogen," Applied Physics Letters, Jul. 1, 2002, vol. 81, No. 1, pp. 73-75).

As TFTs using an oxide semiconductor, TFTs having a bottom gate structure and a top gate structure have heretofore been reported. In either of the structures, a gate insulating film is disposed between an active layer (oxide semiconductor layer) and a gate electrode.

SUMMARY

However, a TFT with a laminated structure of a gate electrode, a gate insulating film, and an active layer as described above has the following problems. First, film peeling occurs at an interface between the gate electrode and the gate insulating film or an interface between the gate insulating film and the active layer due to difference between the in-film stresses of the respective layers.

Second, because a wiring layer used as a signal line, a scanning line, power supply wiring, or the like of a display device is often formed at the same time as the gate electrode of the TFT or the like, the resistance value of the wiring layer is increased depending on the film thickness or material of the gate electrode or the like.

The present disclosure has been made in view of such problems. It is desirable to provide a display device exhibiting stable electric characteristics in which display device film peeling at interfaces of a thin film transistor is prevented while low resistance of a wiring layer is maintained, and an electronic device including the display device.

A first display device according to an embodiment of the present disclosure includes: a thin film transistor; and a wiring layer; wherein the thin film transistor includes a semiconductor layer, a gate electrode disposed so as to be opposed to the semiconductor layer, the gate electrode being different in thickness from the wiring layer, and a gate insulating film between the semiconductor layer and the gate electrode.

A second display device according to an embodiment of the present disclosure includes: a thin film transistor; and a wiring layer; wherein the thin film transistor includes a semiconductor layer, a gate electrode disposed so as to be opposed to the semiconductor layer, at least a part of constituent material being different between the gate electrode and the wiring layer, and a gate insulating film between the semiconductor layer and the gate electrode.

In the first display device according to an embodiment of the present disclosure, the wiring layer and the gate electrode are different from each other in thickness. In the second display device, at least a part of constituent material differs between the wiring layer and the gate electrode. Thus, the electric resistance of the wiring layer and the in-film stress of the gate electrode are each controlled. For example, when the thickness of the gate electrode is smaller than the thickness of the wiring layer, the in-film stress of the gate electrode is reduced without the electric resistance in the wiring layer being raised as compared with a case in which the gate electrode and the wiring layer have a same thickness. In addition, for example, when the wiring layer has a laminated structure composed of two respective layers of a same material as the gate electrode and a material having lower electric resistance than the gate electrode, the electric resistance of the wiring layer is decreased without the in-film stress of the gate electrode being raised as compared with a case in which the gate electrode and the wiring layer are formed of a same constituent material.

A first electronic device and a second electronic device according to embodiments of the present disclosure respectively include the first display device and the second display device according to the foregoing embodiments of the present disclosure.

In the first display device and the first electronic device according to embodiments of the present disclosure, the wiring layer and the gate electrode are different from each other in thickness. In the second display device and the second electronic device, at least a part of constituent material is different between the wiring layer and the gate electrode. Therefore the electric resistance of the wiring layer and the in-film stress of the gate electrode can both be controlled. Hence, it is possible to prevent film peeling at interfaces of the thin film transistor while maintaining the low resistance of the wiring layer, and thus obtain stable electric characteristics.

BRIEF DESCRIPTION OF THE DRAWINGS

FIG. 9 is a diagram showing differences in in-film stress between semiconductor layers in an amorphous state and a crystalline state;

FIG. 10 is a diagram showing relation between the film thickness of the gate electrode and susceptibility to film peeling;

FIG. 20A is a front view of a fifth example of application in an opened state, FIG. 20B is a side view of the fifth example of application in the opened state, FIG. 20C is a front view of the fifth example of application in a closed state, FIG. 20D is a left side view of the fifth example of application in the closed state, FIG. 20E is a right side view of the fifth example of application in the closed state, FIG. 20F is a top view of the fifth example of application in the closed state, and FIG. 20G is a bottom view of the fifth example of application in the closed state.

DETAILED DESCRIPTION OF THE PREFERRED EMBODIMENTS

Preferred embodiments of the present disclosure will hereinafter be described in detail with reference to the drawings. Incidentally, description will be made in the following order.
1. First Embodiment (Example of Bottom Gate Type Thin Film Transistor)
2. Second Embodiment (Example of Top Gate Type Thin Film Transistor)

[First Embodiment]

Figure 1:
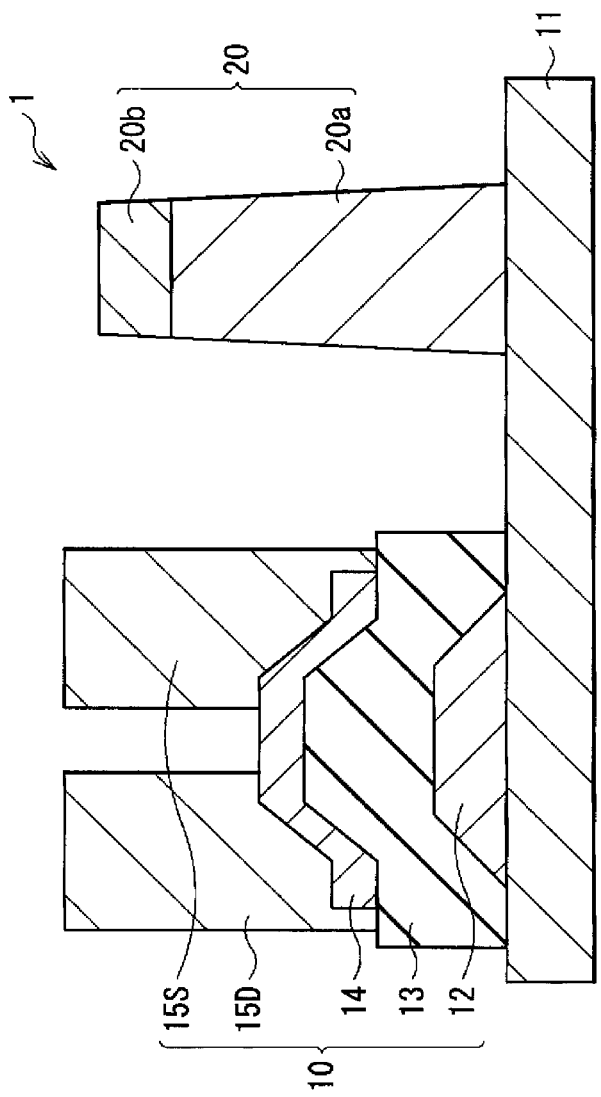
FIG. 1 is a sectional view of principal parts of a structure of a display device according to a first embodiment of the present disclosure.

FIG. 1 shows a part of a sectional structure of a display device (display device 1) according to a first embodiment. The display device 1 is for example a liquid crystal display device, an organic EL (Electroluminescence) display device, or the like driven by a thin film transistor 10. A wiring layer 20 is disposed on a substrate 11 together with the thin film transistor 10. The thin film transistor 10 has a structure of a bottom gate type (inversely staggered structure). The thin film transistor 10 for example has a gate electrode 12, a gate insulating film 13, a semiconductor layer 14, a source electrode 15S, and a drain electrode 15D in this order from the side of the substrate 11.

Figure 2:
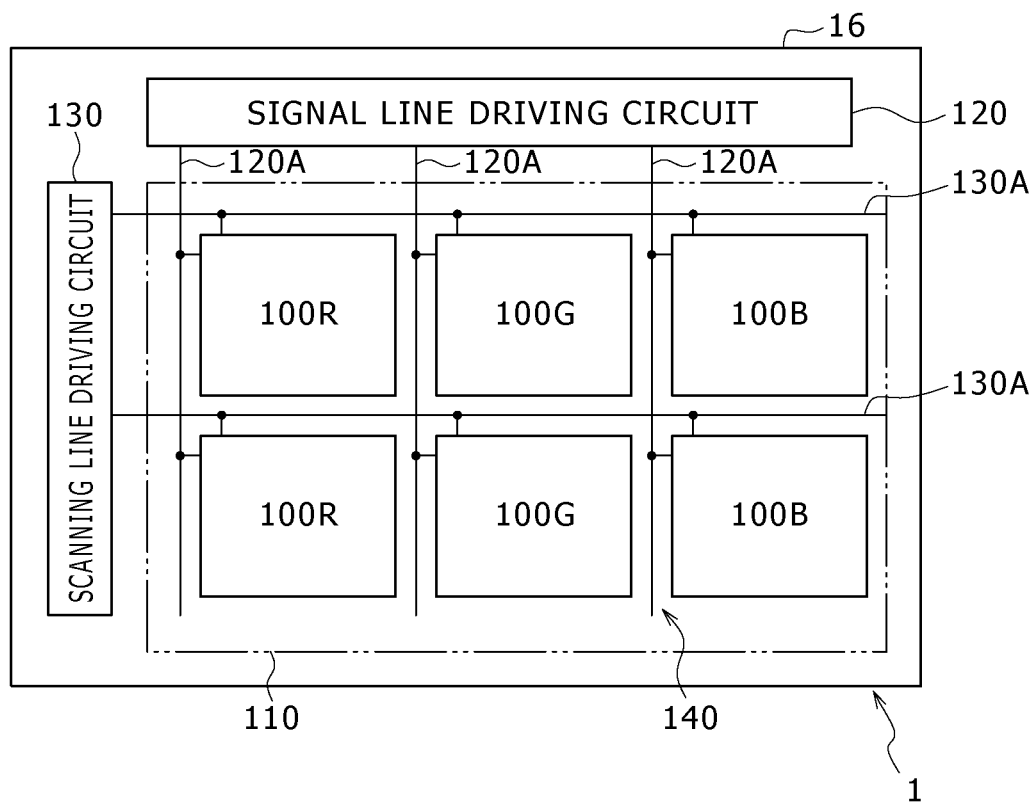
FIG. 2 is a diagram showing an example of a circuit configuration of the display device shown in FIG. 1.

As shown in FIG. 2, for example, the display device 1 includes a plurality of pixels 100R, 100G, and 100B disposed in the form of a matrix and various driving circuits for driving these pixels 100R, 100G, and 100B on a driving panel 16. The pixels 100R, 100G, and 100B are each a liquid crystal display element or an organic EL element for emitting color light of red (R: Red), green (G: Green), and blue (B: Blue). A display region 110 is formed by a plurality of pixel groups with three such pixels 100R, 100G, and 100B forming one pixel group. A signal line driving circuit 120 and a scanning line driving circuit 130, which are a driver for video display, and a pixel driving circuit 140, for example, are disposed as a driving circuit on the driving panel 16. A sealing panel not shown in FIG. 2 is laminated to the driving panel 16. The pixels 100R, 100G, and 100B and the driving circuit are sealed by the sealing panel.

Figure 3:
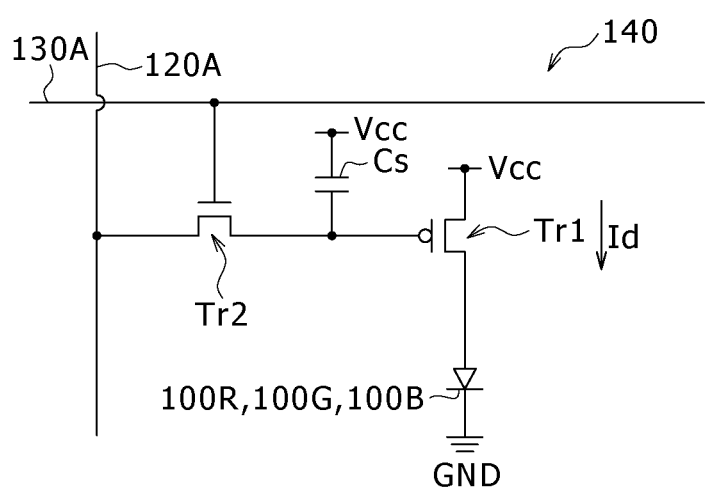
FIG. 3 is a diagram showing an example of a pixel driving circuit shown in FIG. 2.

As shown in FIG. 3, the pixel driving circuit 140 has a transistor Tr1 and a transistor Tr2 as the thin film transistor 10 and a capacitor Cs in a region between the transistors Tr1 and Tr2. A pixel 100R (or a pixel 100G or 100B) is connected in series with the transistor Tr1 between a first power supply line (Vcc) and a second power supply line (GND). The signal line driving circuit 120 supplies an image signal to the source electrode of the transistor Tr2 through one of a plurality of signal lines 120A arranged in a column direction. The scanning line driving circuit 130 sequentially supplies a scanning signal to the gate electrode of the transistor Tr2 through one of a plurality of scanning lines 130A arranged in a row direction. The wiring layer 20 shown in FIG. 1 functions as a signal line 120A, a scanning line 130A, or power supply wiring.

The substrate 11 is formed by a glass substrate, a plastic film, or the like. Plastic materials include for example PET (polyethylene terephthalate), PEN (polyethylene naphthalate), and the like. An inexpensive plastic film can be used as the substrate 11 when the semiconductor layer 14 can be formed by a sputtering method or the like without the substrate 11 being heated.

The gate electrode 12 has a role of applying a gate voltage to the thin film transistor 10 and controlling carrier density in the semiconductor layer 14 by the gate voltage. The gate electrode 12 is disposed with a thickness of 20 nm to 80 nm in a selective region on the substrate 11. Thicknesses less than 20 nm cause a problem of an increase in sheet resistance of the gate electrode 12 or nonuniformity of film thickness, and also make it difficult to cover an underlayer in a wiring laminated structure. Thicknesses exceeding 80 nm tend to cause a problem of stress within the film. In the present embodiment, the gate electrode 12 is thinner than the wiring layer 20. Thus, film peeling occurring at an interface between the gate electrode 12 and the gate insulating film 13 or an interface between the gate insulating film 13 and the semiconductor layer 14 can be prevented. The gate electrode 12 is for example formed of a metallic simple substance or an alloy of platinum (Pt), titanium (Ti), ruthenium (Ru), molybdenum (Mo), copper (Cu), tungsten (W), nickel (Ni), aluminum (Al), tantalum (Ta), or the like. The gate electrode 12 may also be formed by a transparent conductive thin film such as an indium tin oxide (ITO), an indium zinc oxide (IZO), a zinc oxide (ZnO), or the like.

The gate insulating film 13 is disposed with a thickness in a range of 50 nm to 1 μm, for example, between the gate electrode 12 and the semiconductor layer 14. The gate insulating film 13 is for example formed by an insulating film including at least one of a silicon oxide film, a silicon nitride film, a silicon oxynitride film, a hafnium oxide film, an aluminum oxide film, an aluminum nitride film, a tantalum oxide film, a zirconium oxide film, a hafnium oxynitride film, a hafnium silicon oxynitride film, an aluminum oxynitride film, a tantalum oxynitride film, and a zirconium oxynitride film. The gate insulating film 13 may be of a single-layer structure, or may be of a laminated structure of two kinds of layers or more. When the gate insulating film 13 has a laminated structure of two kinds of layers or more, the characteristics of the interface with the semiconductor layer 14 can be improved, and the mixing in of an impurity from an outside air into the semiconductor layer 14 can be prevented.

The semiconductor layer 14 is disposed in the form of an island on the gate insulating film 13, and forms a channel region in such a position as to be opposed to the gate electrode 12 between the source electrode 15S and the drain electrode 15D. The semiconductor layer 14 is for example formed by an oxide semiconductor including oxide of at least one kind of element selected from indium (In), gallium (Ga), zinc (Zn), tin (Sn), aluminum (Al), and titanium (Ti) as a base. Specifically, the semiconductor layer 14 is formed by a transparent oxide semiconductor including a zinc oxide as a base, for example an indium gallium zinc oxide (IGZO), a zinc oxide, an aluminum-doped zinc oxide (AZO), or a gallium-doped zinc oxide (GZO). The thickness of the semiconductor layer 14 is desirably 5 nm to 100 nm in consideration of efficiency of oxygen supply by annealing in a manufacturing process.

The semiconductor layer 14 may be in an amorphous state or a crystalline state. However, when the semiconductor layer 14 is in a crystalline state, the semiconductor layer 14 has high resistance to an etching solution, and is thus easily applied to the formation of a device structure. For example, whereas an oxide semiconductor in an amorphous state can be easily etched by a PAN (Phosphoric-Acetic-Nitric acid; a mixed solution including a phosphoric acid, an acetic acid, a nitric acid, and water) base solution or a hydrogen fluoride base solution, an oxide semiconductor in a crystalline state is not easily etched by a PAN base solution or a hydrogen fluoride base solution. The use of a crystalline oxide semiconductor is desired from viewpoints of etching resistance, the highness of mobility, the realization of a P-channel TFT, and cost. Crystalline oxide semiconductor materials include for example ITO (Indium Tin Oxide), IGO (Indium Gallium Oxide), IZO (Indium Zinc Oxide), or the like, which includes indium as a base, as well as ZnO (Zinc Oxide) and the like. However, as will be described later in detail, these crystalline materials tend to have higher in-film stress and cause film peeling more as compared with amorphous materials. In the display device 1, the gate electrode 12 is thinner than the wiring layer 20. Thus, even when the semiconductor layer 14 is formed of a crystalline material, film peeling at interfaces between the gate electrode 12, the gate insulating film 13, and the semiconductor layer 14 can be prevented. The semiconductor layer 14 is not limited to an oxide semiconductor material, but may be formed of a material including silicon (Si).

The source electrode 15S and the drain electrode 15D are disposed on the semiconductor layer 14, and are electrically connected to the semiconductor layer 14. The source electrode 15S and the drain electrode 15D are for example either a single layer film as a metallic film made of molybdenum, aluminum, copper, titanium, ITO, or an alloy thereof or a laminated film formed of two kinds or more of these metallic films. For example a three-layer film formed by laminating molybdenum, aluminum, and molybdenum in this order with respective thicknesses of 50 nm, 500 nm, and 50 nm makes it possible to stably retain the electric characteristics of the semiconductor layer 14. In addition to molybdenum, a metallic film including oxygen such as ITO, a titanium oxide, or the like may be formed so as to be in contact with the semiconductor layer 14. When the semiconductor layer 14 is formed of an oxide semiconductor material, and is in contact with a metallic film that easily extracts oxygen, the oxygen of the oxide semiconductor is extracted, so that a defect is formed. Hence, the use of a metallic film including oxygen in parts of the source electrode 15S and the drain electrode 15D which parts are in contact with the semiconductor layer 14 can stabilize the electric characteristics of the thin film transistor 10.

The wiring layer 20 is disposed on a selected region of the substrate 11 according to a wiring layout, and has a structure formed by laminating a wiring layer 20a and a wiring layer 20b from the side of the substrate 11. The wiring layer 20a is for example formed of a material having low resistance such as aluminum, copper (Cu), gold (Au), or the like. The wiring layer 20b is for example formed of molybdenum, titanium, tungsten, or the like as the same material as the gate electrode 12. While the wiring layer 20 desirably has low resistance, metals having low resistance such as aluminum, copper (Cu), and the like tend to cause metal migration or hillock formation as a result of high-temperature treatment in a manufacturing process. On the other hand, molybdenum, titanium, tungsten, or the like used for the gate electrode 12 is a refractory metal, and is not easily changed in a manufacturing process. That is, the wiring layer 20 having low resistance and capable of resisting high temperatures in a manufacturing process can be formed by laminating the wiring layer 20b formed of a refractory metal to the wiring layer 20a formed of a low-resistance metal. For example, the wiring layer 20a has a film thickness of about 100 nm to 1 μm, and the wiring layer 20b has the same film thickness as the gate electrode 12, that is, a film thickness of about 20 nm to 80 nm. That is, in the present embodiment, the wiring layer 20 has a larger film thickness than the gate electrode 12.

Figure 4:
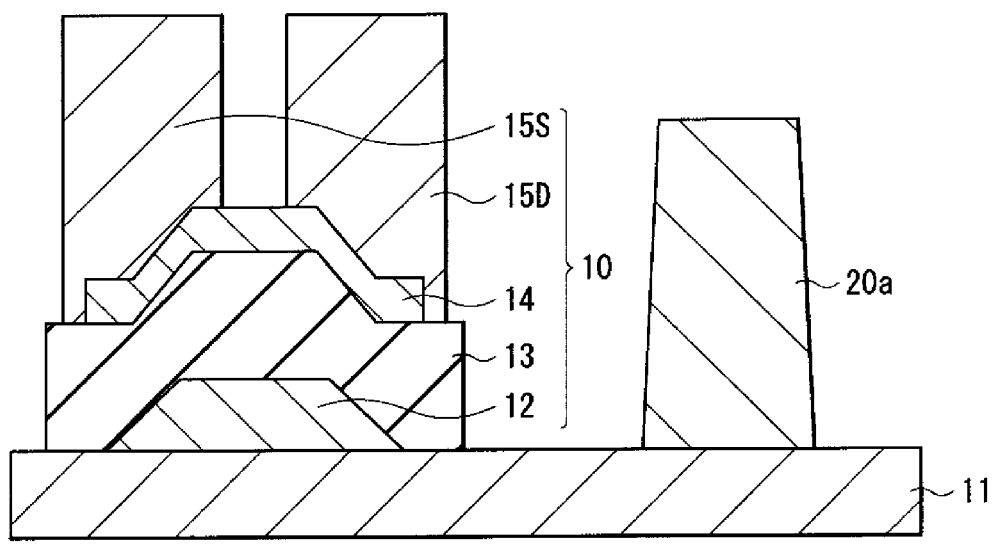
FIG. 4 is a sectional view of an example of modification of the display device shown in FIG. 1.

The wiring layer 20 may have a multilayer structure of three layers or more. In addition, when the wiring layer 20 have sufficiently low resistance and is capable of resisting a high-temperature environment in a manufacturing process, the wiring layer 20 may be of a single-layer structure formed of only the wiring layer 20a as shown in FIG. 4.

The display device 1 can be manufactured as follows, for example.

Figure 5A:
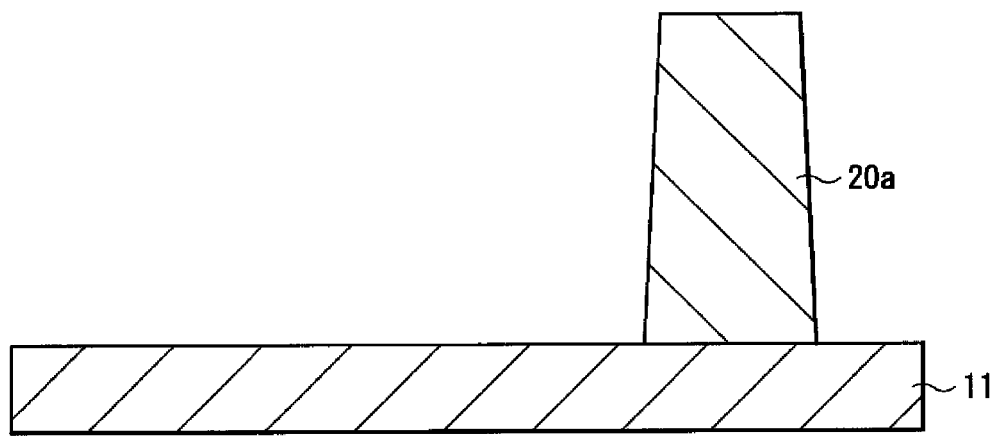
FIGS. 5A and 5B are sectional views showing a method of manufacturing the display device shown in FIG. 1 in order of processes.
Figure 5B:
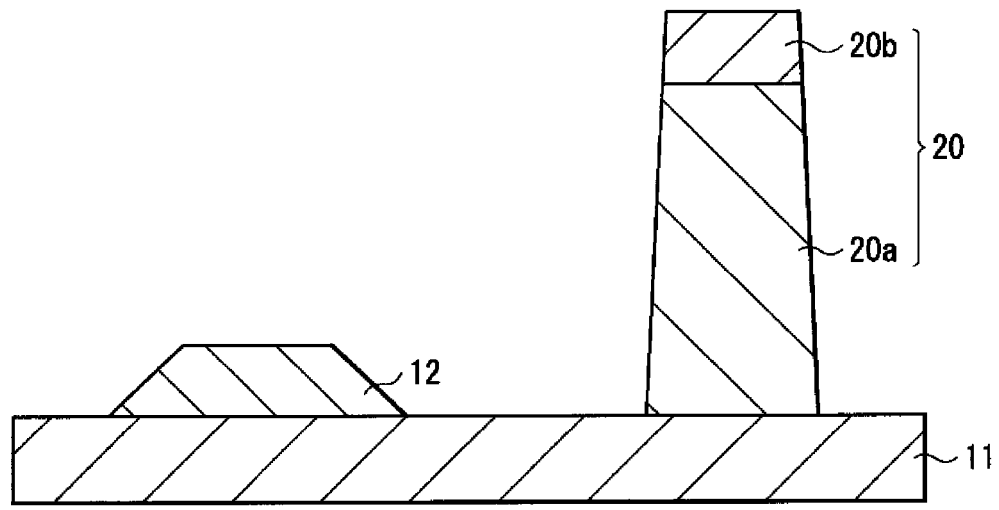

FIGS. 5A to 5D represent a method of manufacturing the display device 1 in order of processes. First, a metallic film made of aluminum, copper, or gold, for example, is formed with for example a film thickness of 100 nm to 1 μm on the entire surface of a substrate 11 by using for example a sputtering method or a CVD (Chemical Vapor Deposition) method. As shown in FIG. 5A, a wiring layer 20a is formed by patterning the metallic film by using photolithography and an etching method. Next, a metallic film made of for example molybdenum, titanium, or tungsten is formed with for example a film thickness of 20 nm to 80 nm on the substrate 11 and the wiring layer 20a by for example a sputtering method, and is patterned to form a gate electrode 12 and a wiring layer 20b (FIG. 5B). When the gate electrode 12 and the wiring layer 20b are thus formed of the same material with the same film thickness, the gate electrode 12 and the wiring layer 20b can be formed in the same process. That is, when the wiring layer 20 has a multilayer structure and at least one layer of the multilayer structure is formed in the same process as the gate electrode 12, manufacturing processes can be simplified. Incidentally, the wiring layer 20a may be laminated on the wiring layer 20b after the gate electrode 12 and the wiring layer 20b are formed (constitution with the wiring layer 20b on the side of the substrate 11), or the formation of the gate electrode 12 and the formation of the wiring layer 20 may be performed in completely different processes.

Figure 5C:
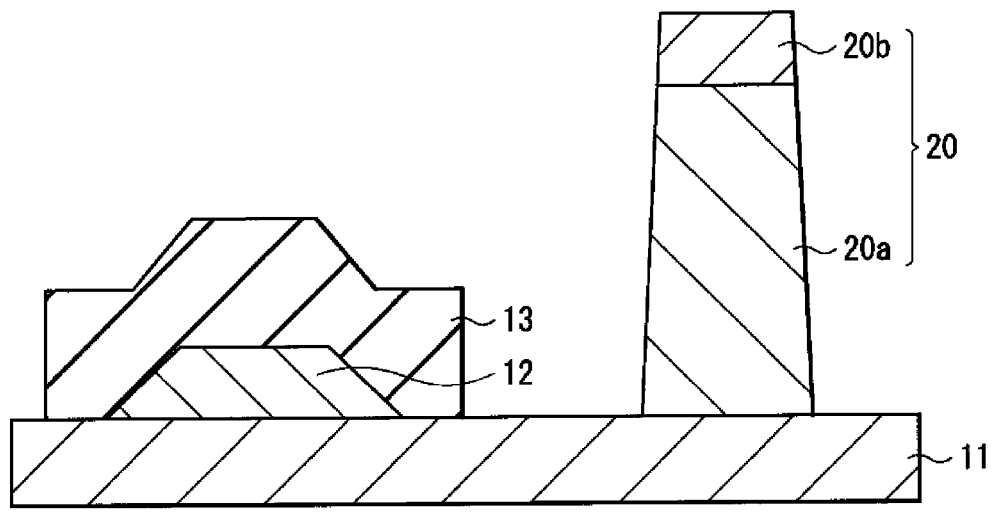
FIGS. 5C and 5D are sectional views showing processes continued from FIG. 5B.

Next, as shown in FIG. 5C, a gate insulating film 13 made of a laminated film of a silicon nitride film and a silicon oxide film is formed on a part of the substrate 11 and the entire surface of the gate electrode 12 by a plasma CVD method, for example. The formation of the gate insulating film 13 by the plasma CVD method is performed by forming the silicon nitride film using for example a gas of silane, ammonia ($NH_3$), and nitrogen ($N_2$) as a source gas and forming the silicon oxide film using for example a gas including silane and dinitrogen monoxide as a source gas. In addition, the gate insulating film 13 may be formed by a silicon nitride film, a silicon oxide film, an aluminum oxide film, or an aluminum nitride film by a sputtering method in place of the plasma CVD method. In the sputtering method, silicon is used as a target, and reactive plasma sputtering is performed with oxygen, a water vapor, nitrogen, and the like flowing in a discharge atmosphere for sputtering, whereby a silicon oxide film, a silicon nitride film, or the like is formed.

Figure 5D:
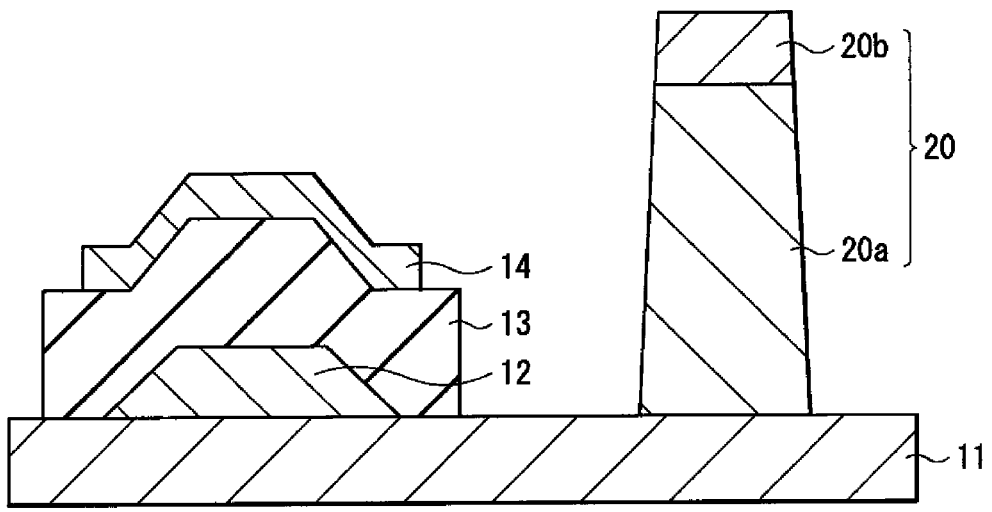

After the formation of the gate insulating film 13, as shown in FIG. 5D, an oxide semiconductor film, for example, is formed on the gate insulating film 13 by for example a sputtering method, and the oxide semiconductor film is patterned to thereby form a semiconductor layer 14. The structure of an amorphous silicon TFT is similar to the structure of a TFT using an oxide semiconductor for an active layer. However, whereas amorphous silicon can be formed by a CVD method, it is difficult to form an oxide semiconductor film by a CVD method. This is because of low vapor pressure of an organic compound including a constituent element of the oxide semiconductor and absence of a carrier gas suitable for a CVD method. Thus, an oxide semiconductor film is generally formed by a sputtering method.

For example, when the semiconductor layer 14 is formed by an indium gallium zinc oxide, the semiconductor layer 14 is formed on the gate insulating film 13 by performing plasma discharge with a mixed gas of argon (Ar) and oxygen ($O_2$) using a DC (Direct Current) sputtering method with a ceramic of an indium gallium zinc oxide as a target. Incidentally, a gas of argon and oxygen is introduced after the inside of a vacuum vessel is evacuated to a degree of vacuum of $1 \times 10^{-4}$ Pa or less before the plasma discharge.

In addition, when the semiconductor layer 14 is formed by a zinc chloride, for example, an RF (Radio Frequency) sputtering method is carried out with a ceramic of a zinc chloride as a target. Alternatively, the semiconductor layer 14 can be formed by performing a sputtering method using a DC power supply in a gas atmosphere including argon and oxygen using a metallic target of zinc.

At this time, carrier density in the semiconductor layer 14 forming a channel can be controlled by changing a flow ratio between argon and oxygen at the time of oxide formation.

Figure 6A:
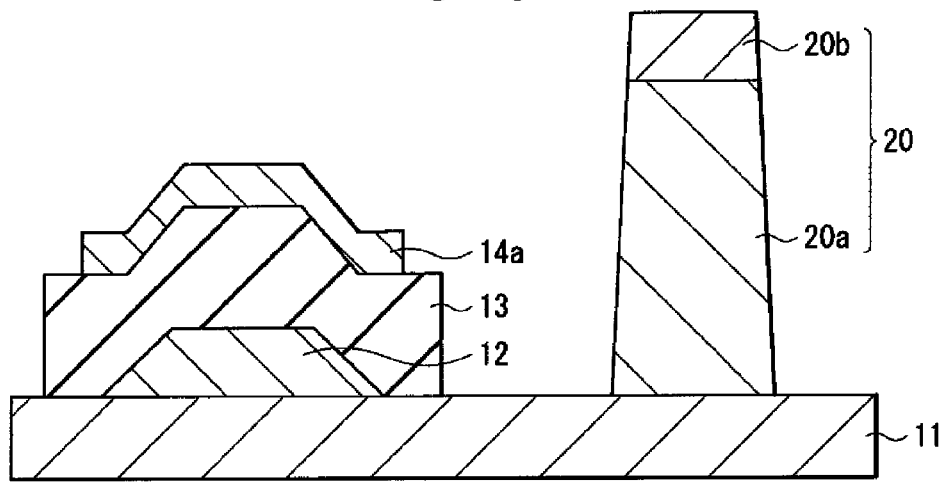
FIGS. 6A, 6B, and 6C are sectional views of a process of conversion from a semiconductor layer in an amorphous state to a semiconductor layer in a crystalline state in the display device shown in FIG. 1.
Figure 6B:
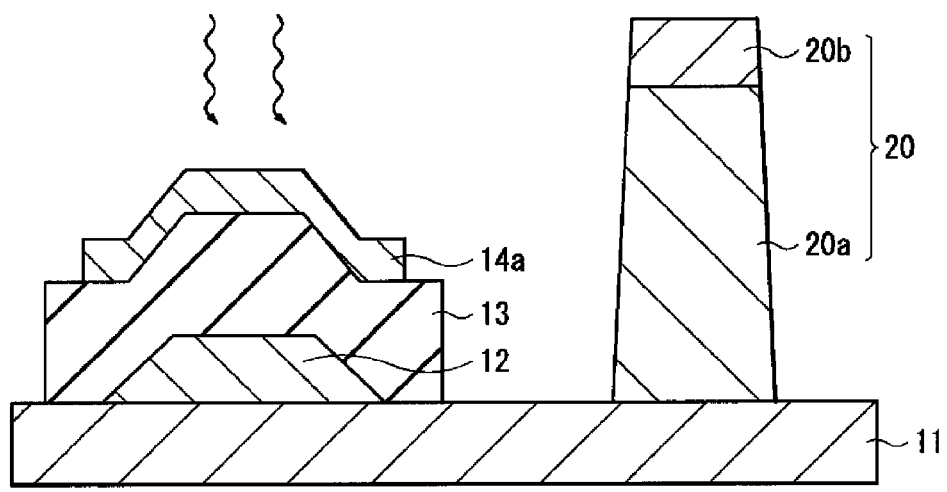
Figure 6C:
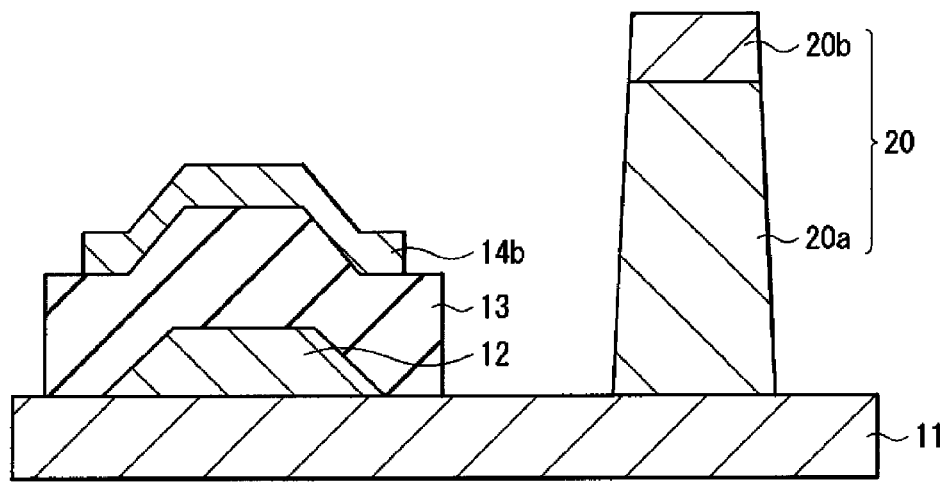

Further, when the semiconductor layer 14 is formed of a crystalline oxide semiconductor, for example, as shown in FIGS. 6A to 6C, a semiconductor layer 14a in an amorphous state is formed (FIG. 6A), and thereafter crystallization annealing treatment is performed by irradiating the semiconductor layer 14a with laser light L, for example (FIG. 6B) to form a semiconductor layer 14b in a crystalline state (FIG. 6C). Crystalline materials include for example oxide semiconductors that are formed of a zinc oxide, indium, gallium, zirconium, tin, and the like and in which the ratio of indium or tin is higher than the others.

After the semiconductor layer 14 is formed, a molybdenum layer having a thickness of 50 nm, an aluminum layer having a thickness of 500 nm, and a molybdenum layer having a thickness of 50 nm are formed in order by a sputtering method, for example, whereby a laminated structure of the three layers is formed. Next, the laminated structure is patterned by a wet etching method using a mixed solution including a phosphoric acid, a nitric acid, and an acetic acid to form a source electrode 15S and a drain electrode 15D. As a result of the above, the thin film transistor 10 and the wiring layer 20 shown in FIG. 1 are completed. The display device 1 is manufactured by thus forming the pixel driving circuit 140 including the thin film transistor 10 and the wiring layer 20 and thereafter further forming pixels 100R, 100G, and 100B.

In the display device 1, a scanning signal is supplied from the scanning line driving circuit 130 to each pixel via the gate electrode of the writing transistor Tr2, and an image signal is supplied from the signal line driving circuit 120 to each pixel via the writing transistor Tr2 and retained by the storage capacitor Cs. That is, the transistor Tr1 is controlled to be turned on or off according to the signal retained by the storage capacitor Cs. Thereby a driving current is injected into the pixels 100R, 100G, and 100B. In these transistors Tr1 and Tr2 (thin film transistor 10), when a voltage (gate voltage) equal to or higher than a threshold voltage is applied to the gate electrode 12 via a wiring layer such as the wiring layer 20 or the like, a current (drain current) occurs in a channel region of the semiconductor layer 14 between the source electrode 15S and the drain electrode 15D, and driving is performed as described above.

In this case, the thickness of the gate electrode 12 is smaller than that of the wiring layer 20, or is specifically 20 nm to 80 nm. Thus, the in-film stress of the gate electrode 12 is reduced, and the occurrence of film peeling at the interfaces between the gate electrode 12, the gate insulating film 13, and the semiconductor layer 14 can be prevented.

Figure 7:
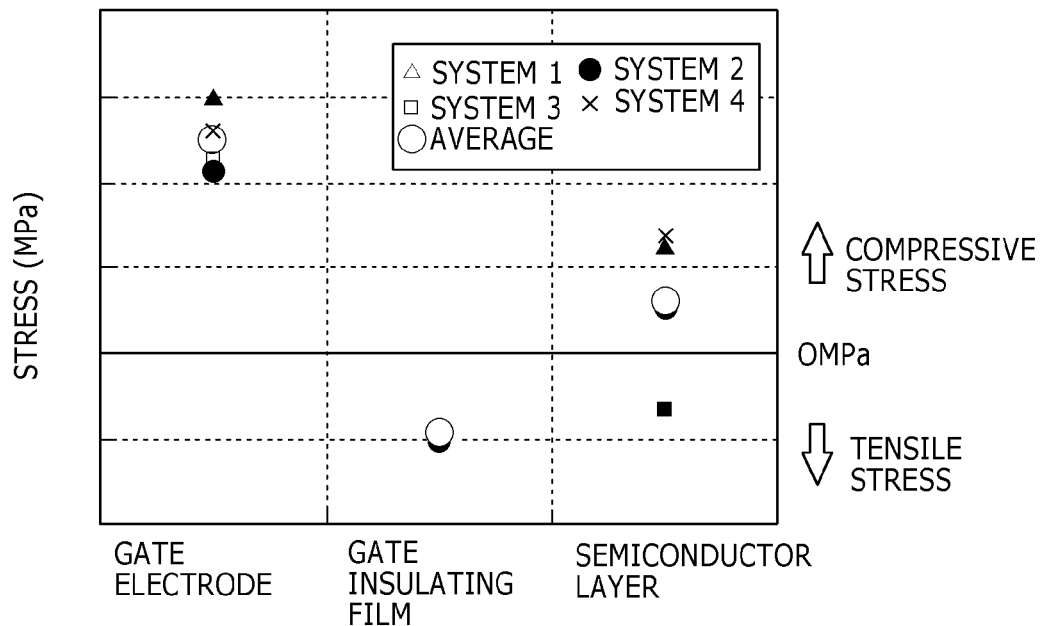
FIG. 7 is a diagram showing the in-film stress of a gate electrode, a gate insulating film, and a semiconductor layer.

FIG. 7 shows the in-film stress of each of the gate electrode, the gate insulating film, and the semiconductor layer. Incidentally, the gate electrode and the semiconductor layer were formed of molybdenum of 50 nm and a crystalline oxide semiconductor material of 50 nm, respectively, by using a sputtering method, and the gate insulating film was formed by $SiO_2$ of 100 nm by a CVD method.

As shown in FIG. 7, the gate electrode and the semiconductor layer exhibit high compressive stress, and the gate insulating film exhibits tensile stress. The magnitude of stress depends on a film forming method. Some thin films formed by a sputtering method have high compressive stress exceeding 1 GPa.

Figure 8:
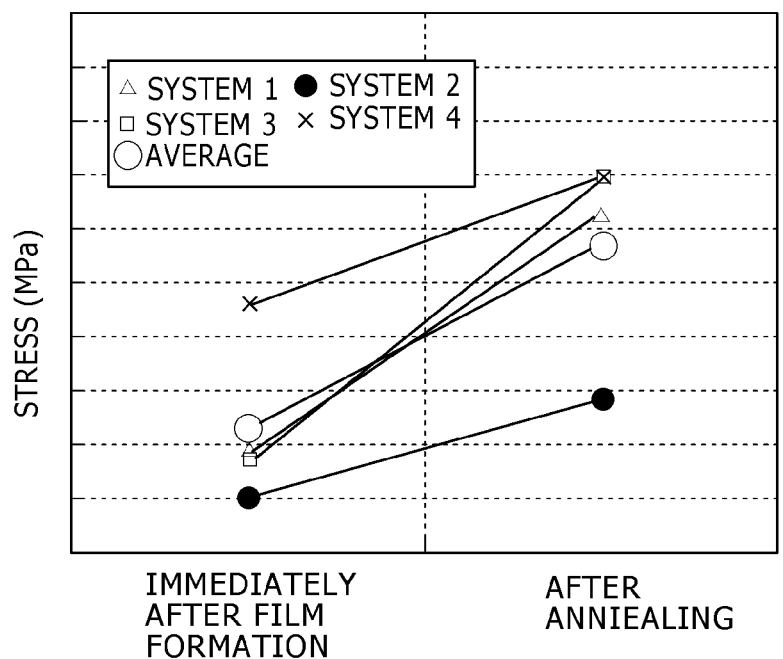
FIG. 8 is a diagram showing changes in in-film stress of the gate electrode, the gate insulating film, and the semiconductor layer after an annealing process.

When the semiconductor layer is formed by an oxide semiconductor, high electron mobility is obtained as compared with amorphous silicon (a-Si: H) used in the past. In addition, high mobility can be expected even when the semiconductor layer is made in low-temperature conditions in the vicinity of room temperature. However, as described above, an oxide semiconductor is formed by a sputtering method in most cases, and thus the semiconductor layer has high compressive stress. Further, as shown in FIG. 8, the compressive stress of the semiconductor layer is increased also by carrier density control performed after the formation of the film and annealing treatment (200° C. or higher) for recovery from process damage.

In addition, as shown in FIG. 9, an oxide semiconductor in a crystalline state may exhibit an in-film stress of about 2 GPa, and tends to exhibit higher compressive stress as compared with an oxide semiconductor in an amorphous state. A thin semiconductor film may be formed to reduce the stress. However, because the film thickness and film quality of the semiconductor layer greatly affects the electric characteristics of the transistor, it is difficult to make the TFT with the film thickness or film quality of the semiconductor layer greatly changed. A crystalline oxide semiconductor in particular needs a film thickness of 20 nm or more in order to maintain the characteristics of a crystalline material. In addition, the gate insulating film having a reduced film thickness may cause a short circuit between the gate electrode and the semiconductor layer. Thus it is also difficult to change the film thickness or film quality of the gate insulating film from a viewpoint of maintaining the stability of device characteristics and a yield.

Because the gate electrode is for example formed in the same process as the wiring layer such as signal and power supply wiring or the like, a reduction in the film thickness of the gate electrode results in an increase in the resistance value of the wiring layer. That is, it is difficult to lower the resistance value of the wiring layer and reduce the stress of the gate electrode when the gate electrode and the wiring layer are formed of the same constituent material with the same film thickness.

In the display device 1, on the other hand, the thickness of the gate electrode 12 is smaller than the thickness of the wiring layer 20, thus making it possible to lower the resistance value of the wiring layer 20 and reduce the stress of the gate electrode 12.

As shown in FIG. 10, it has been confirmed that film peeling at the interfaces between the gate electrode 12, the gate insulating film 13, and the semiconductor layer 14 in the thin film transistor 10 does not occur when the film thickness of the gate electrode 12 is 80 nm or less, or desirably 70 nm or less. Incidentally, in this case, the gate insulating film 13 has a film thickness of 100 nm, the semiconductor layer 14 is formed by a crystalline oxide semiconductor film with a film thickness of 50 nm, and the wiring layer 20 is formed by Al with a film thickness of 1000 nm. It has also been confirmed that the wiring layer 20 has a sufficiently low resistance value.

Figure 11:
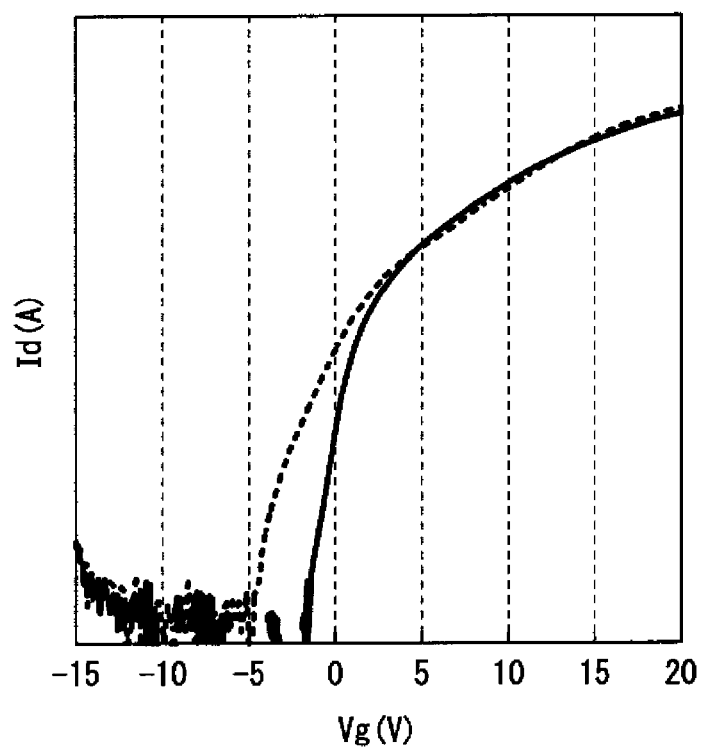
FIG. 11 is a diagram of Vg (gate voltage)-Id (drain current) characteristics when the film thickness of the gate electrode is changed.

FIG. 11 shows Vg (gate voltage)-Id (drain current) characteristics in a case where the gate electrode 12 is formed by molybdenum with a film thickness of 50 nm by a solid line and Vg (gate voltage)-Id (drain current) characteristics in a case where the gate electrode 12 is formed by molybdenum with a film thickness of 100 nm by a dotted line. It can be confirmed that a reduction in the film thickness of the gate electrode 12 makes the slope of a subthreshold characteristic steep and thus improves TFT characteristics.

Thus, in the display device 1 according to the present embodiment, the gate electrode 12 has a smaller thickness than the wiring layer 20. The in-film stress of the gate electrode 12 can therefore be reduced without raising electric resistance in the wiring layer 20 as compared with a case where the gate electrode 12 and the wiring layer 20 have a same thickness. Hence, it is possible to prevent film peeling at the interfaces of the thin film transistor 10 while maintaining the low resistance of the wiring layer 20 and thus obtain stable electric characteristics. In particular, as described with reference to FIG. 7, when the gate electrode and the semiconductor layer are formed by a sputtering method, the in-film stress of the gate electrode and the semiconductor layer is often high compressive stress. The present embodiment is thus effective in forming the semiconductor layer 14 of an oxide semiconductor.

In addition, the resistance value of the wiring layer 20 can be further lowered when the wiring layer 20a as a part of the wiring layer 20 is formed by a material having a lower resistance value than the constituent material of the gate electrode 12.

Incidentally, the electric resistance of the wiring layer 20 and the in-film stress of the gate electrode 12 can both be controlled by making at least a part of constituent material differ between the wiring layer 20 and the gate electrode 12 irrespective of relation between the thickness of the wiring layer 20 and the thickness of the gate electrode 12. For example, when the wiring layer 20 is formed by the two layers of the wiring layer 20b made of the same material as the gate electrode 12 and the wiring layer 20a made of a material having a lower electric resistance than the wiring layer 20b, the electric resistance of the wiring layer 20 can be reduced without the in-film stress of the gate electrode 12 being raised.

[Second Embodiment]

Figure 12:
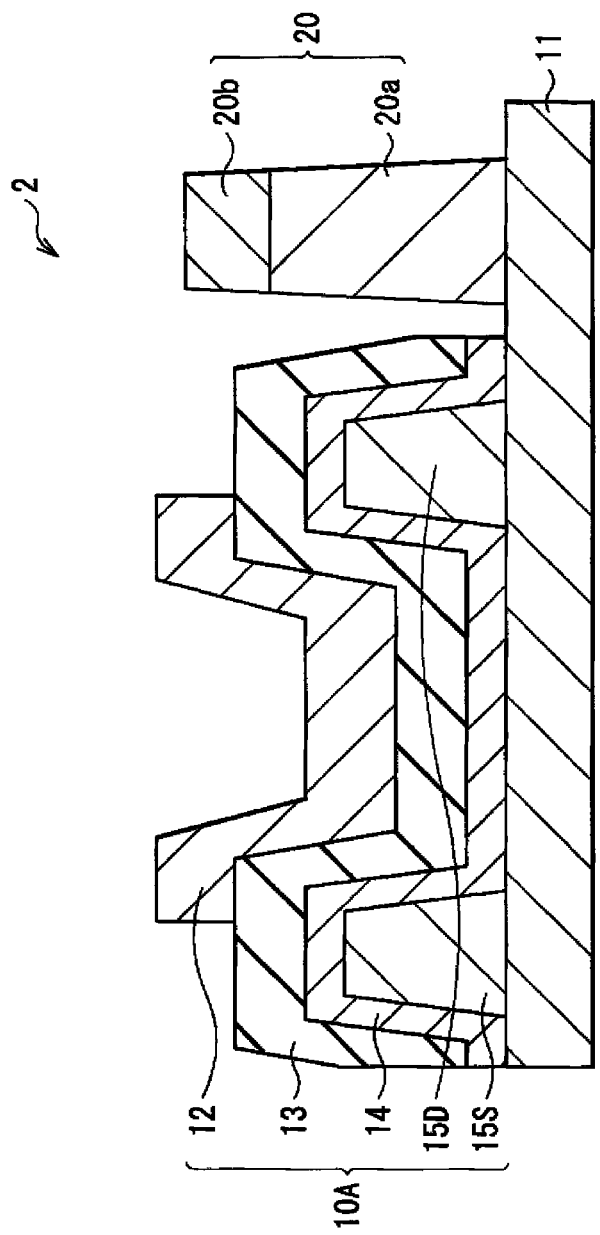
FIG. 12 is a sectional view of principal parts of a structure of a display device according to a second embodiment of the present disclosure.

FIG. 12 shows a sectional constitution of a display device (display device 2) according to a second embodiment of the present disclosure. This display device 2 is different from the foregoing first embodiment in that the display device 2 is formed by a thin film transistor 10A of a top gate type (staggered type). While arrangement relation between constituent elements of the thin film transistor 10A in the display device 2 is different from that of the thin film transistor 10, the respective functions and constituent materials of the constituent elements of the thin film transistor 10A in the display device 2 are similar to those of the thin film transistor 10. The constituent elements of the thin film transistor 10A in the display device 2 are therefore identified by the same reference numerals for convenience, and description thereof will be omitted as appropriate.

The thin film transistor 10A has a source electrode 15S and a drain electrode 15D, a semiconductor layer 14, a gate insulating film 13, and a gate electrode 12 laminated in this order on a substrate 11. A method for manufacturing the display device 2 including the thin film transistor 10A and a wiring layer 20 will be described with reference to FIGS. 13A to 15B.

Figure 13A:
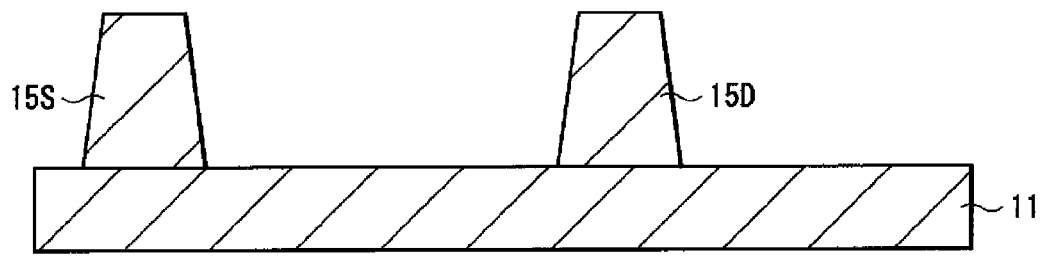
FIGS. 13A and 13B are sectional views showing a method of manufacturing the display device shown in FIG. 12 in order of processes.

As shown in FIG. 13A, an aluminum film having a film thickness of 500 nm and a molybdenum film having a film thickness of 50 nm are formed in this order on the substrate 11 by a sputtering method, for example. Thereafter wet etching is performed with a mixed solution including a phosphoric acid, a nitric acid, and an acetic acid to form a source electrode 15S and a drain electrode 15D of a double-layer structure.

Figure 13B:
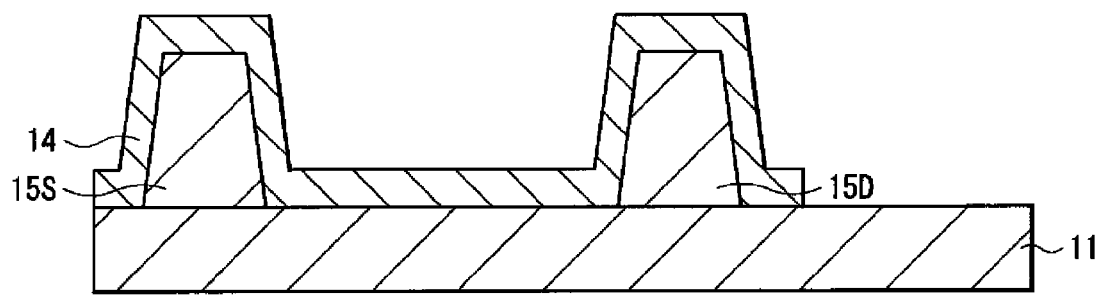
Figure 14A:
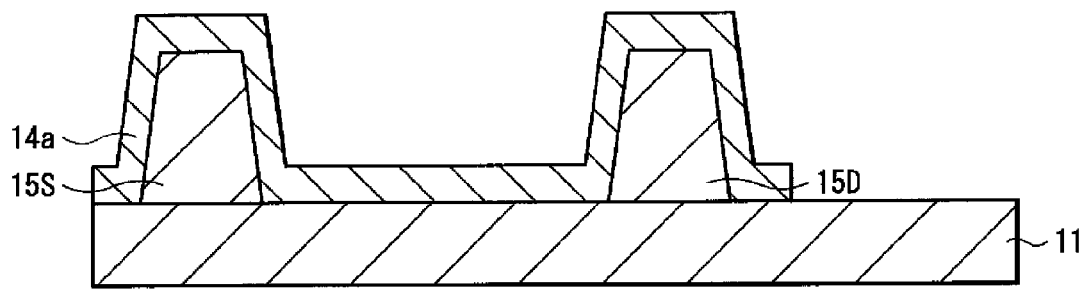
FIGS. 14A, 14B, and 14C are sectional views of a process of conversion from a semiconductor layer in an amorphous state to a semiconductor layer in a crystalline state in the display device shown in FIG. 12.
Figure 14B:
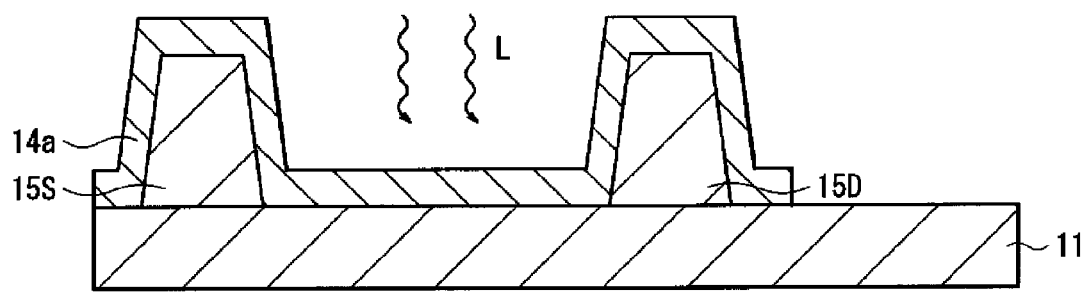
Figure 14C:
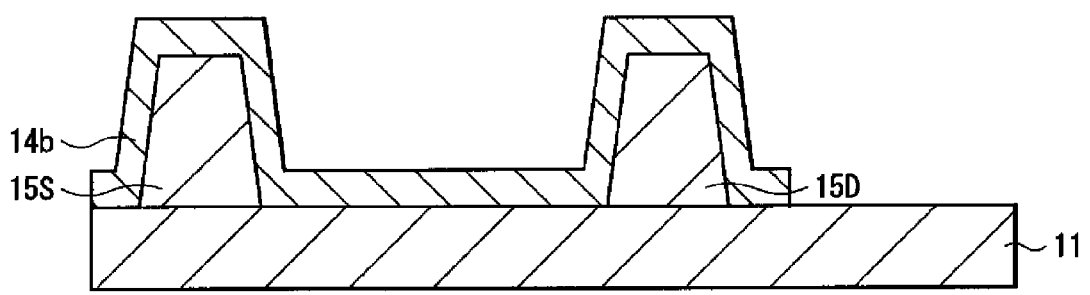

Next, as shown in FIG. 13B, a semiconductor layer 14 made of an oxide semiconductor is formed on the substrate 11 and on the source electrode 15S and the drain electrode 15D by a sputtering method, for example, as in the first embodiment. At this time, as shown in FIGS. 14A to 14C, after a semiconductor layer 14a in an amorphous state is formed (FIG. 14A), annealing treatment by irradiation with laser light L may be performed (FIG. 14B) to form a semiconductor layer 14b in a crystalline state (FIG. 14C).

Figure 15A:
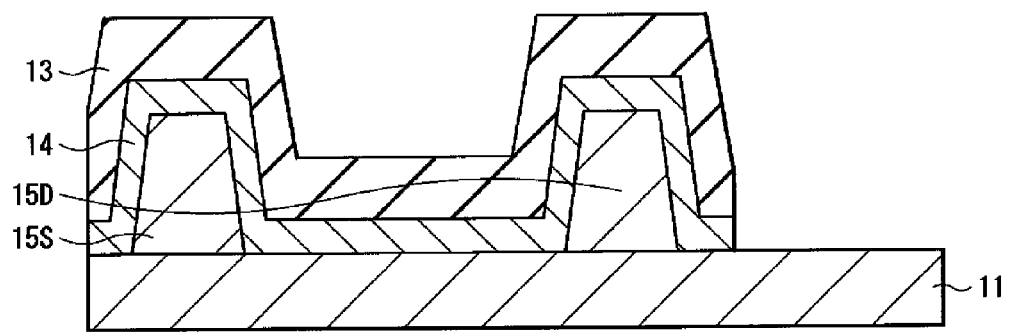
FIGS. 15A and 15B are sectional views showing processes continued from FIG. 13B or FIG. 14C.

Next, as shown in FIG. 15A, a gate insulating film 13 is formed on the entire surface of the substrate 11 and the semiconductor layer 14. A constituent material and a film forming method for the gate insulating film 13 are similar to those of the first embodiment.

Figure 15B:
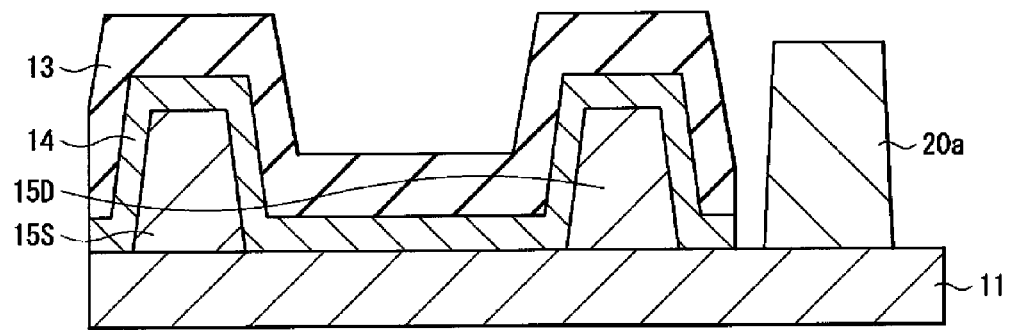

Thereafter, as shown in FIG. 15B, for example, a wiring layer 20a made of a metal having low resistance such as aluminum, copper, gold, or the like is formed with a film thickness of 100 nm to 1 μm. After the wiring layer 20a is formed, a metallic film made of for example molybdenum, titanium, or tungsten is formed with for example a film thickness of 20 nm to 80 nm on the gate insulating film 13 and on the wiring layer 20a, and is patterned to form a gate electrode 12 and a wiring layer 20b. The display device 2 shown in FIG. 12 is consequently completed. The film thickness of the gate electrode 12 is adjusted to be smaller than the film thickness of the wiring layer 20.

Incidentally, in the thin film transistor 10A of the top gate structure, the gate electrode 12 is formed in a process subsequent to that of the semiconductor layer 14. Thus, annealing treatment or the like for conversion from a semiconductor layer 14a in an amorphous state to a semiconductor layer 14b in a crystalline state, for example, does not need to be performed after the formation of the gate electrode 12. That is, because of a little chance of the gate electrode 12 being placed under a high-temperature environment, the wiring layer 20 does not need to have strong resistance to thermal stress. Hence, the wiring layer 20 may also be a lamination obtained by forming the wiring layer 20b on the substrate 11 simultaneously with the formation of the gate electrode 12 and thereafter laminating the wiring layer 20a made of a low-resistance metal to the wiring layer 20b. Alternatively, the wiring layer 20 may also be of a single-layer structure including only the wiring layer 20a made of a low-resistance metal.

Effect and action of the display device 2 is similar to that of the first embodiment.

Such display devices 1 and 2 can be incorporated into electronic devices shown in the following first to fifth examples of application, for example.

FIRST EXAMPLE OF APPLICATION

Figure 16:
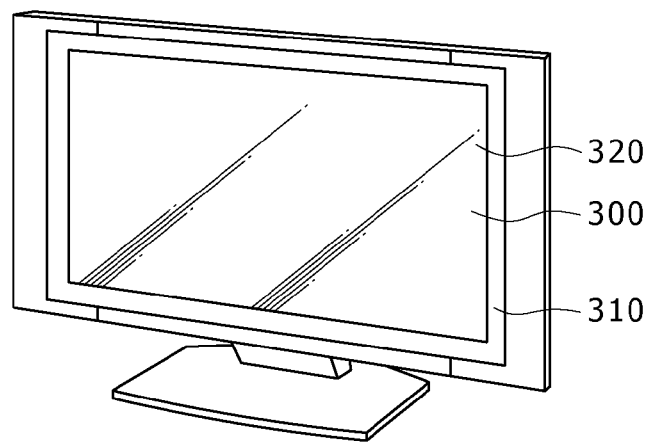
FIG. 16 is a perspective view of an external appearance of a first example of application.

FIG. 16 shows an external appearance of a television device. This television device has for example a video display screen section 300 including a front panel 310 and a filter glass 320.

SECOND EXAMPLE OF APPLICATION

Figure 17A:
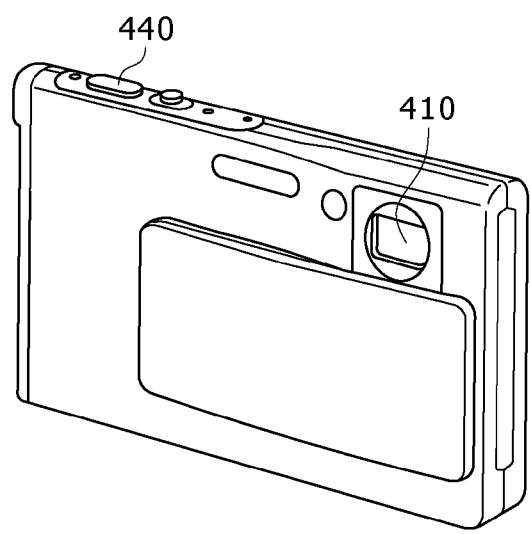
FIG. 17A is a perspective view of an external appearance of a second example of application as viewed from a front side.
Figure 17B:
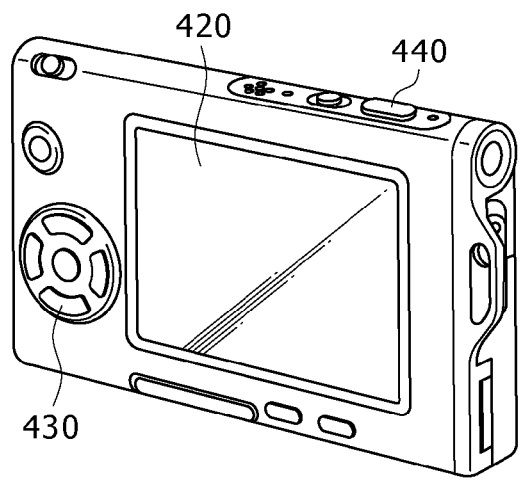
FIG. 17B is a perspective view of the second example of application as viewed from a back side.

FIGS. 17A and 17B show an external appearance of a digital still camera. This digital still camera has for example a light emitting section 410 for flashlight, a display section 420, a menu switch 430, and a shutter button 440.

THIRD EXAMPLE OF APPLICATION

Figure 18:
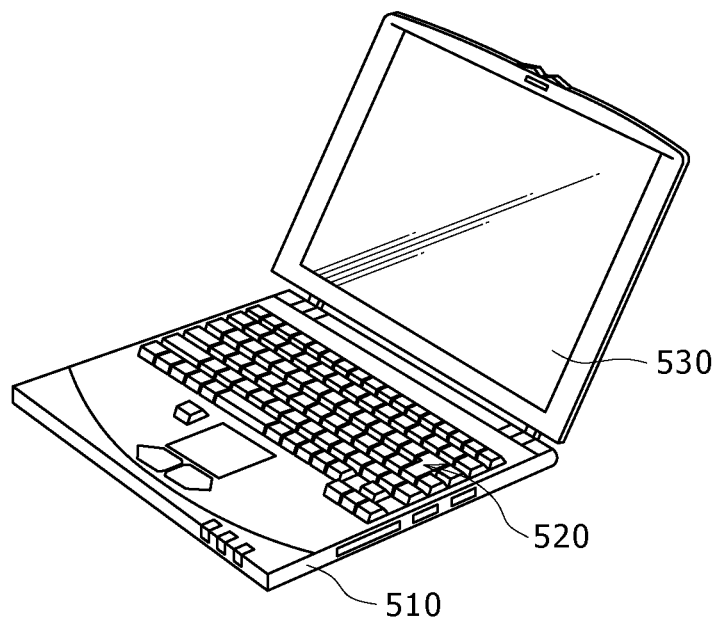
FIG. 18 is a perspective view of an external appearance of a third example of application.

FIG. 18 shows an external appearance of a notebook personal computer. This notebook personal computer has for example a main unit 510, a keyboard 520 for an operation of inputting characters and the like, and a display section 530 for displaying an image.

FOURTH EXAMPLE OF APPLICATION

Figure 19:
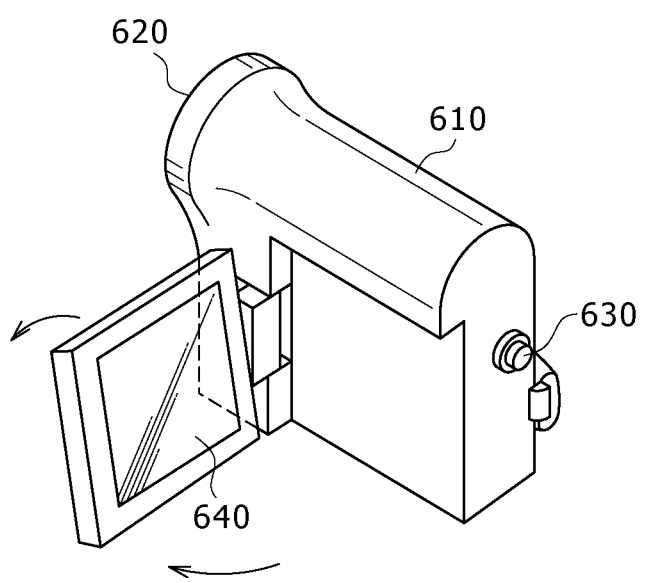
FIG. 19 is a perspective view of an external appearance of a fourth example of application.

FIG. 19 shows an external appearance of a video camera. This video camera has for example a main body section 610, a lens 620 for taking a subject which lens is provided in a front side surface of the main body section 610, a start/stop switch 630 at a time of picture taking, and a display section 640.

FIFTH EXAMPLE OF APPLICATION

FIGS. 20A to 20G show an external appearance of a portable telephone. This portable telephone is for example formed by coupling an upper side casing 710 and a lower side casing 720 to each other by a coupling part (hinge part) 730. The portable telephone has a display 740, a sub-display 750, a picture light 760, and a camera 770.

The present disclosure has been described above by citing embodiments thereof. However, the present disclosure is not limited to the foregoing embodiments, but is susceptible of various modifications. For example, the materials and thicknesses or the film forming methods and film forming conditions or the like of the respective layers described in the foregoing embodiments are not limited, but may be other materials and thicknesses or other film forming methods and film forming conditions.

Further, the present disclosure is applicable to display devices having not only liquid crystal displays and organic EL displays but also other display elements such as inorganic electroluminescence elements, electrodeposition type or electrochromic type display elements, and the like.

Incidentally, in the foregoing embodiments, description has been made of a case in which the thickness of the gate electrode 12 is smaller than the thickness of the wiring layer 20. It is also possible, however, to make the film thickness of the gate electrode 12 larger than the film thickness of the wiring layer 20 by achieving favorable conditions of the resistance value of the wiring layer 20 and the in-film stress of the gate electrode 12 by forming the wiring layer 20 with a metal having a sufficiently low resistance, for example.

The present disclosure contains subject matter related to that disclosed in Japanese Priority Patent Application JP 2011-053288 filed in the Japan Patent Office on Mar. 10, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A display device comprising: a thin film transistor; and a wiring layer in contact with a substrate; wherein said thin film transistor includes a semiconductor layer, a gate electrode disposed so as to be opposed to said semiconductor layer, the gate electrode being different in thickness from said wiring layer, and a gate insulating film between said semiconductor layer and said gate electrode, wherein the gate insulating film is not in contact with the wiring layer, wherein the wiring layer is formed as a separate component from a source and a drain, and wherein the source and the drain are connected to the semiconductor layer, wherein said wiring layer has a multilayer structure comprising an upper layer that is furthest from the substrate, and wherein the upper layer has a film thickness that is the same as a gate film thickness of said gate electrode.

2. The display device according to claim 1, wherein thickness of said gate electrode is smaller than thickness of said wiring layer.

3. The display device according to claim 1, wherein said wiring layer has a multilayer structure, and film thickness and constituent material of at least one layer are same as film thickness and constituent material of said gate electrode.

4. The display device according to claim 1, wherein at least a part of constituent material is different between said wiring layer and said gate electrode.

5. The display device according to claim 1, wherein at least a part of said wiring layer is formed of a material having lower electric resistance than constituent material of said gate electrode.

6. The display device according to claim 1, wherein said semiconductor layer is formed by an oxide semiconductor film.

7. The display device according to claim 1, wherein said semiconductor layer is formed by a crystalline oxide semiconductor.

8. The display device according to claim 1, wherein said gate electrode and said semiconductor layer are formed by a sputtering method.

9. The display device according to claim 1, wherein said thin film transistor has a structure formed by laminating said gate electrode, said gate insulating film, said semiconductor layer, and a source electrode and a drain electrode electrically connected to said semiconductor layer in this order from a side of a substrate.

10. The display device according to claim 1, wherein said thin film transistor has a structure formed by laminating a source electrode and a drain electrode electrically connected to said semiconductor layer, said semiconductor layer, said gate insulating film, and said gate electrode in this order from a side of a substrate.

11. A display device comprising: a thin film transistor; and a wiring layer in contact with a substrate; wherein said thin film transistor includes a semiconductor layer, a gate electrode disposed so as to be opposed to said semiconductor layer, at least a part of constituent material being different between the gate electrode and said wiring layer, and a gate insulating film between said semiconductor layer and said gate electrode, wherein the gate insulating film is not in contact with the wiring layer, wherein said wiring layer has a multilayer structure comprising an upper layer that is furthest from the substrate, and wherein the upper layer has a film thickness that is the same as a gate film thickness of said gate electrode.

12. The display device according to claim 11, wherein said wiring layer has a multilayer structure, and includes at least one layer formed of a same constituent material with a same film thickness as said gate electrode and one layer formed of a material having lower electric resistance than constituent material of said gate electrode, and wherein the wiring layer is formed as a separate component from a source and a drain, and wherein the source and the drain are connected to the semiconductor layer.

13. An electronic device comprising: a display device; wherein said display device includes a thin film transistor, and a wiring layer in contact with a substrate, and said thin film transistor includes a semiconductor layer, a gate electrode disposed so as to be opposed to said semiconductor layer, the gate electrode being different in thickness from said wiring layer, and a gate insulating film between said semiconductor layer and said gate electrode, wherein the gate insulating film is not in contact with the wiring layer, wherein the wiring layer is formed as a separate component from a source and a drain, and wherein the source and the drain are connected to the semiconductor layer, wherein said wiring layer has a multilayer structure comprising an upper layer that is furthest from the substrate, and wherein the upper layer has a film thickness that is the same as a gate film thickness of said gate electrode.

14. An electronic device comprising: a display device; wherein said display device includes a thin film transistor, and a wiring layer in contact with a substrate, and said thin film transistor includes a semiconductor layer, a gate electrode disposed so as to be opposed to said semiconductor layer, at least a part of constituent material being different between the gate electrode and said wiring layer, and a gate insulating film between said semiconductor layer and said gate electrode, wherein the gate insulating film is not in contact with the wiring layer, wherein said wiring layer has a multilayer structure comprising an upper layer that is furthest from the substrate, and wherein the upper layer has a film thickness that is the same as a gate film thickness of said gate electrode.

15. The device of claim 1, wherein the wiring layer is laminated to the substrate.

16. The device of claim 1, wherein the wiring layer is formed by sputtering or chemical vapor deposition.

* * * * *